United States Patent [19]

Tokuda et al.

[11] Patent Number: 4,788,689
[45] Date of Patent: Nov. 29, 1988

[54] COMPOSITE RESONATOR-TYPE SEMICONDUCTOR LASER DEVICE

[75] Inventors: Yasunori Tokuda; Kenzo Fujiwara, both of Amagasaki, Japan

[73] Assignee: Mitsubishi Denki Kabushiki Kaisha, Japan

[21] Appl. No.: 829,969

[22] Filed: Feb. 18, 1986

[30] Foreign Application Priority Data

Feb. 26, 1985 [JP] Japan .................................. 60-39591

[51] Int. Cl.[4] .............................................. H01S 3/19
[52] U.S. Cl. ....................................... 372/45; 372/46; 372/50
[58] Field of Search ........................ 372/50, 46, 45, 92

[56] References Cited

PUBLICATIONS

"Disorder Of An AlAs–GaAs Superlattice By Impurity Diffusion", Laidig et al., Applied Physics Letter 38(10), 1981, pp. 776–778.
"GaAlAs Buried Multiquantum Well Lasers Fabricated By Diffusion-induced Disordering", Fukuzawa et al., Applied Physics Letter 45(1), 1984, pp. 1–3.
"Embedded-mirror Semiconductor Laser", Laidig et al., Applied Physics Letter 45(5), 1984, pp. 485–487.

Primary Examiner—James W. Davie
Attorney, Agent, or Firm—Leydig, Voit & Mayer

[57] ABSTRACT

At least a portion of the optical waveguide is formed in a superlattice structure or in a quantum well structure, and crystals are mixed in the portions of the superlattice structure or the quantum well structure that divide the resonator to decrease the refractive index of these portions, in order to form two or more laser portions having different cavity lengths. The semiconductor device can be formed easily and precisely without employing cleavage which involves cumbersome manufacturing steps. Further, the crystal need not be grown on the groove but may simply be grown on a flat surface, making it possible to easily and precisely produce the semiconductor laser device.

16 Claims, 3 Drawing Sheets

COMPOSITE RESONATOR-TYPE SEMICONDUCTOR LASER DEVICE

BACKGROUND OF THE INVENTION

The present invention relates to a process for producing a composite resonator-type semiconductor laser device which can be easily manufactured and which enables the gap between the resonators to be precisely controlled.

FIGS. 1(a) and 1(b) shows the layer structure of a laser device (cleaved coupled cavity laser) in which two laser portions having different cavity lengths are integrated on a chip, which is disclosed, for example, in Scientific American, 1984, p. 148, wherein FIG. 1(a) is a front view and FIG. 1(b) is a section view along the line IVb—IVb thereof. In these drawings, reference numeral 1 denotes a first electrode, 2 denotes a current blocking layer, 3 denotes a cap layer, 4 denotes a first cladding layer, 5 denotes an active layer, 6 denotes a second cladding layer, 7 denotes a substrate, 8 denotes a second electrode, 21 denotes an air gap, 22 denotes a first laser portion, and 23 denotes a second laser portion. Further, an arrow represents a laser beam.

Next, operation of the laser device will be described below. If an electric current is allowed to flow between the first electrode 1 and the second electrode 8, the electrons and holes are confined in the active layer 5 and undergo recombination to emit light. With the diode-type semiconductor laser device, if a current greater than a threshold value is allowed to flow, there develops inversion distribution, and laser beams are oscillated having predetermined wavelengths (longitudinal mode) determined by the lengths of resonators. The mechanism is the same as an ordinary fabry-perot type laser device. With the laser device of FIGS. 1(a) and 1(b) in which two independent laser portions having different cavity lengths are arranged with their optical axes in alignment, however, different longitudinal oscillation modes are generally exhibited by the first laser portion 22 and the second laser portion 23. Among them, only those modes having the same wavelengths interfere with each other to oscillate. Generally, the number of modes can be reduced to one. As described above, the laser device of this type features a stabilized longitudinal mode.

In the foregoing was described the effect that is obtained when the two laser portions are oscillated. Here, however, if the current flowing into the first laser portion 22 is selected to be smaller than a threshold value, and is changed, the number or carriers injected changes making it possible to change the refractive index of the first laser portion 22. Namely, the effect obtained is the same as the case in which the cavity length of the laser device is changed, and the wavelength of oscillation of the second laser portion 23 can be tuned.

In the foregoing was mentioned the composite resonator-type semiconductor laser device (cleaved coupled cavity laser) which employs cleavage. There has also been proposed an interference-type laser device as disclosed in Denpa Shimbun, Dec. 14, 1984, in order to stabilize the longitudinal mode utilizing the former interference effect. The structure of this device is shown in FIGS. 2(a) and 2(b), wherein FIG. 2(a) is a front view and FIG. 2(b) is a section view along the line Vb—Vb thereof. In this laser device, two laser portions having different cavity lengths are formed by growing crystals on a grooved substrate.

The light and/or carriers are confined in the transverse direction (direction of line A—A in FIGS. 1(a) and 1(b) and FIGS. 2(a) and 2(b) ) by the buried structure in FIGS. 1(a) and 1(b) or by the current blocking layer relying upon a V-shaped groove in FIGS. 2(a) and 2(b).

According to the conventional composite resonator-type semiconductor laser device of FIGS. 1(a) and 1(b), the air gap 21 is formed by cleavage involving considerable difficulty. According to the conventional composite resonator-type semiconductor laser device of FIGS. 2(a) and 2(b), on the other hand, the crystals must be grown on the groove involving difficulty in regard to growing the crystals.

SUMMARY OF THE INVENTION

The present invention was accomplished in order to preclude the above-mentioned problems, and its object is to provide a method of producing a composite resonator-type semiconductor laser device having two laser portions of different cavity lengths, easily and precisely.

That is, according to the process for producing a composite resonator-type semiconductor laser device of the present invention, at least a portion of the optical guide path is formed in a superlattice structure or in a quantum well structure, and crystals are mixed in portions of the superlattice structure or in the quantum well structure, thereby forming two or more laser portions having different cavity lengths.

BRIEF DESCRIPTION OF THE DRAWINGS

FIGS. 1(a) and 1(b) shows a conventional composite resonator-type semiconductor laser device, wherein FIG. 1(a) is a front view and FIG. 1(b) is a section view;

FIGS. 2(a) and 2(b) show a conventional interference-type semiconductor laser device, wherein FIG. 2(a) is a front view, and FIG. 2(b) is a section view;

FIGS. 4(a) and 4(b) illustrates another embodiment of the present invention, wherein FIG. 4(a) is a front view, and FIG. 4(b) is a section view.

In these drawings, the same reference numerals denote the same or corresponding portions.

DESCRIPTION OF THE PREFERRED EMBODIMENTS

Figure 1A:
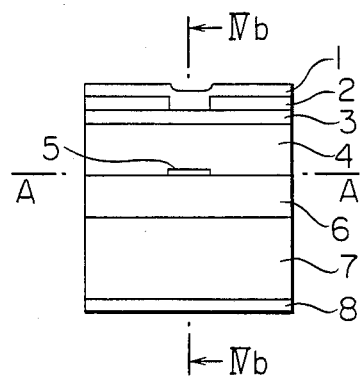
Figure 1B:
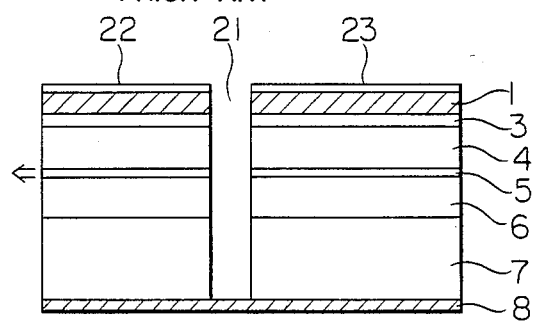
Figure 2A:
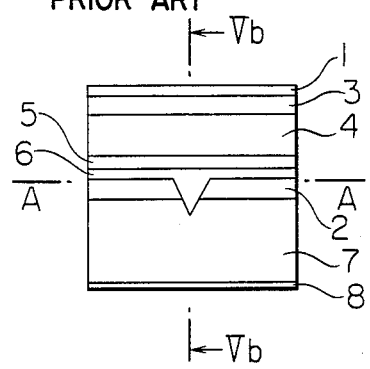
Figure 2B:
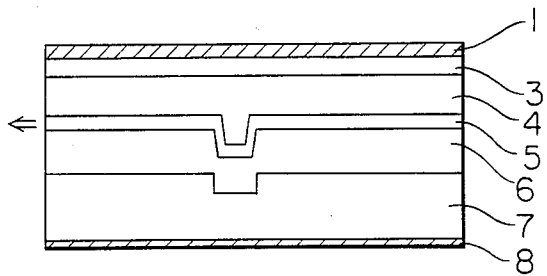
Figure 3A:
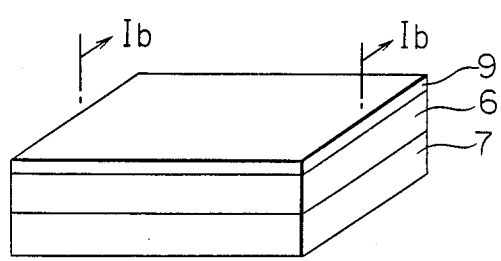
FIGS. 3(a) to 3(f) show a process for producing a composite resonator-type semiconductor laser device according to an embodiment of the present invention, wherein FIGS. 3(a)(b) 3(c)(d) 3(e)(f) illustrate the order of manufacturing steps, FIGS. 3(a)(c)(e) being perspective views, and FIGS. 3(b)(d)(e) being section views.
Figure 3B:
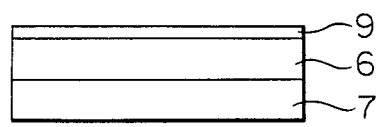
Figure 3C:
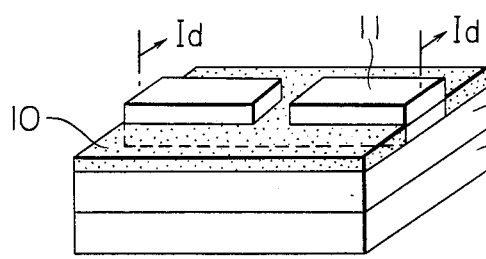
Figure 3D:
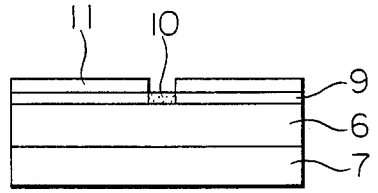
Figure 3E:
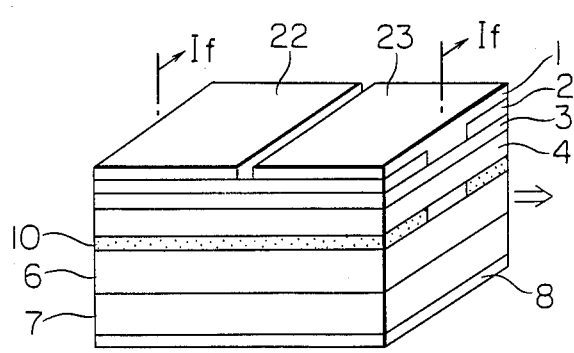
Figure 3F:
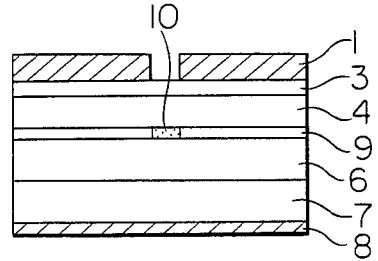

A process for producing the composite resonator-type semiconductor laser device according to an embodiment of the present invention will be described below in conjunction with FIGS. 3(a) to (f), where FIGS. 3(a)(b) - 3(c)(d)–3(e)(f) illustrate the order of manufacturing steps, FIGS. 3(a)(c)(e) being perspective views, FIG. 3(b) being a section view along the line Ib—Ib of FIG. 3(a), FIG. 3(d) being section view along the line Id—Id of FIG. 3(c), and FIG. 3(f) being a section view along the line If—If of FIG. 3(e). Reference numeral 9 denotes an active layer of the multiple quantum wellstructure, 10 denotes a portion where crystals are mixed by the diffusion of zinc, and 11 denotes a mask.

The laser device of FIGS. 3(a)-3(f) is produced as described below. That is, on a p-type GaAs substrate 7 are successively formed a second p-type AlGaAs cladding layer 6 and an actve layer 9 of the multiple quantum well structure (FIGS. 3(a), 3(b)).

A masking material composed of a silicon nitride is formed thereon, and portions of the mask 11 are removed by photolithography to prepare a masking pattern. Portions removed by etching are those portions that divide the resonators, that exist between the laser portions 22 and 23, and that exist on both sides of the laser portions 22, 23 in the transverse direction. The device covered with the masking pattern is annealed together with $ZnAs_2$ at a temperature of several hundred degrees, for example, at 600° C., so that zinc is diffused into portions that are not covered with the mask. The zinc-diffused portions penetrate through the multiple quantum well structure so that crystals are mixed in these portions (FIGS. 3(c), 3(d)). Then, the mask 11 is removed, and a first n-type AlGaAs cladding layer 4 and an n-type GaAs cap layer 3 are successively formed on the flat active layer 9 by the beam epitaxial method. Current blocking layers 2 consisting of $SiO_2$ are then formed at both ends in the transverse direction by the CVD method. Finally, a first electrode 1 and a second electrode 8 are formed by vaporization (FIGS. 3(e), 3(f)) to complete a composite resonator-type semiconductor laser device.

The operation is based upon the same principle as that of the conventional method, and the longitudinal mode is stabilized and the wavelengths are tuned.

In FIGS. 3(a) to 3(f), the device is divided into two resonators by diffusing zinc and, at the same time, the light is confined in the transverse direction. That is, the light is confined in the transverse direction by diffusing zinc into both ends of the laser portions 22, 23 in the transverse direction. However, the light may be confined in the transverse direction relying upon the buried structure.

In addition to diffusing an impurity such as zinc into portions that are not covered with the mask, the crystals can also be mixed by implanting impurities such as zinc ions followed by annealing, or can be directly mixed utilizing the effect of laser annealing relying upon a high-power exposure method.

In the above description, furthermore, the active layer was formed in the multiple quantum well structure. The active layer, however, may be formed in a single quantum well structure or in a superlattice structure. The quantum well structure and the superlattice structure are well known, and, for example, they are obtained by alternatingly stacking several GaAs layers each having a thickness $L_Z$ and several AlGaAs (or AlAs) layers each having a thickness $L_B$. The term "quantum well structure" is used when the thickness $L_B$ is large and the term "superlattice structure" is used when the thickness $L_B$ is small, with a value of about 50 angstroms as a boundary.

Figure 4A:
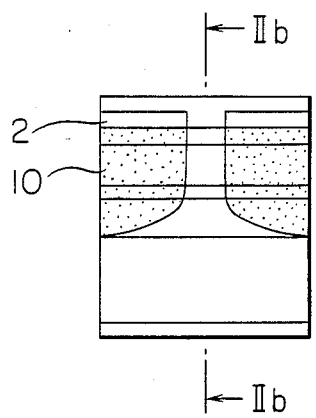
Figure 4B:
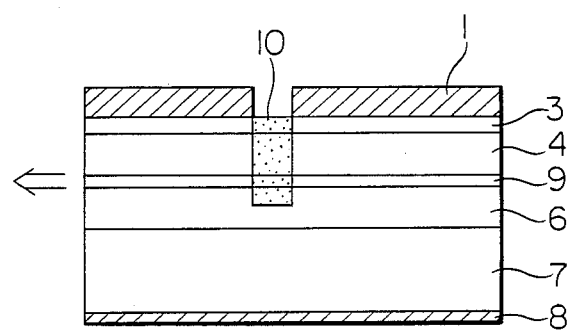
Figure 5:
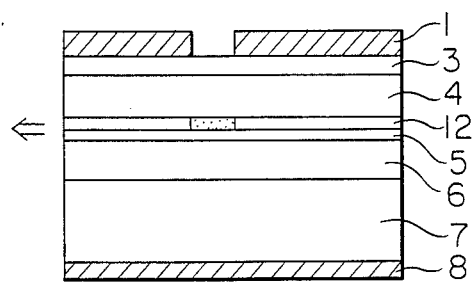
FIG. 5 is a section view which illustrates a further embodiment according to the present invention.

In the case of FIGS. 3(a) to 3(f), furthermore, zinc is selectively diffused after the layers are grown up to the active layer 9. As shown in FIGS. 4(a) and (b), however, the layers may, first, be grown up to the cap layer 3 and, then, the zinc may be selectively diffused to penetrate through the active layer. Here, FIG. 4(a) is a front view of the laser device, and FIG. 4(b) is a section view along the line IIb—IIb of FIG. 4(a).

Furthermore, when an ordinary double hetero laser having a relatively thick active layer is to be used, an optical confinement layer of the superlattice structure of an optical guide layer of the superlattice structure is provided in contact with the active layer 5, and crystals are damaged by diffuzing zinc in a portion which divides the resonator.

Though the above description has dealt with the case where the resonator is divided at one portion only, it is also allowable to divide the resonator at a plurality of portions and to damage crystals in such portions in order to form two or more laser portions having different cavity lengths on the same substrate.

To isolate the electric current between the first laser portion 22 and the second laser portion 23, furthermore, the layers above the active layer 9 should be of the n-type. This is effective to obtain a tuning effect.

According to the present invention as described above, at least a portion of the optical waveguide is formed in the superlattice structure or in the quantum well structure, and crystals are mixed in the portions of the superlattice structure or the quantum well structure that divide the resonator to decrease the refractive index of these portions, in order to form two or more laser portions having different cavity lengths. Therefore, the semiconductor device can be formed easily and precisely without employing cleavage which involves cumbersome manufacturing steps. Further, the crystal needs not be grown on the groove but may simply be grown on a flat surface, making it possible to easily and precisely produce the semiconductor laser device.

What is claimed is:

1. A composite resonator-type semiconductor laser device comprising:
   a semiconductor substrate of a first type of conductivity;
   a second cladding layer which consists of a semiconductor layer of the first type of conductivity formed on said substrate;
   an active layer of one of a quantum well structure and a superlattice structure formed on the upper surface of said second cladding layer;
   a portion of damaged crystal which is formed in said active layer in a direction at least perpendicular to the direction of light propagation thereby to isolate the active layer;
   a first cladding layer which consists of a semiconductor layer of a second type of conductivity formed on the upper surface of said active layer;
   a cap layer which consists of a semiconductor layer of the second type of conductivity formed on said first cladding layer;
   a first electrode connected to said cap layer; and
   a second electrode connected to said semiconductor substrate.

2. A composite resonator-type semiconductor laser device according to claim 1, wherein crystals are damaged by diffusing or implanting zinc, silicon or beryllium into the active layer.

3. A composite resonator-type semiconductor laser device according to claim 1 wherein crystals are directly damaged in the active layer by utilizing the effect of laser annealing.

4. A composite resonator-type semiconductor laser device according to claim 1 wherein the semiconductor substrate comprises a p-type GaAs substrate, the second cladding layer comprises a p-type AlGaAs layer, the active layer comprises an $Al_xGa_{l-x}AsAl_yGa_{l-y}As$ superlatice layer, $0 \leq x < 1$ and $0 < y \leq 1$, the first cladding layer comprises an n-type AlGaAs layer, and the cap layer comprises an n-type GaAs layer.

5. A composite resonator-type semiconductor laser device according to claim 1 wherein the semiconductor substrate comprises an n-type GaAs substrate, the second cladding layer comprises an n-type AlGaAs layer, the active layer comprises an $Al_xGa_{l-x}As/Al_yGa_{l-y}As$ superlattice layer wherein $0 \leq x < 1$ and $0 < y \leq 1$, the first cladding layer comprises a p-type AlGaAs layer, and the cap layer comprises a p-type GaAs layer.

6. A composite resonator-type semiconductor laser device according to claim 4 wherein crystals are damaged by diffusing or implanting zinc or beryllium.

7. A composite resonator-type semiconductor laser device according to claim 4 wherein crystals are damaged by diffusing or implanting silicon, tin, tellurium or selenium.

8. A composite resonator-type semiconductor laser device comprising:
- a semiconductor substrate of a first type of conductivity;
- a second cladding layer which comprises a semiconductor layer of the first type of conductivity formed on said substrate;
- an optical waveguide layer including an active layer forme on the upper surface of said second cladding layer;
- a superlattice layer which is formed on the upper surface of said active layer and which serves as an optical confinement layer;
- a portion of damaged crystals which is formed in said optical waveguide layer in a direction substantially perpendicular to the direction of light propagation and which isolates the optical waveguide layer;
- a first cladding layer which comprises a semiconductor layer of a second type of conductivity formed on the upper surface of said superlattice layer;
- a cap layer which comprises a semiconductor layer of the second type of conductivity formed on said first cladding layer;
- a first electrode connected to said cap layer; and
- a second electrode connected to said semiconductor substrate.

9. A composite resonator-type semiconductor laser device according to claim 8 wherein crystals are damaged by diffusing or implanting zinc, silicon or beryllium into the active layer.

10. A composite resonator-type semiconductor laser device according to claim 8 wherein crystals are directly damaged in the superlattice layer by utilizing the effect of laser annealing.

11. A composite resonator-type semiconductor laser device according to claim 8 wherein the semiconductor substrate comprises a p-type GaAs substrate, the second cladding layer comprises a p-type AlGaAs layer, the active layer comprises a GaAs layer, the optical confinement layer comprises an $Al_2Ga_{l-x}As/Al_yGa_{l-y}As$ superlattice layer where $0 < x < 1$, $0 < y \leq 1$, the first cladding layer comprises an n-type AlGaAs layer, and the cap layer comprises an n-type GaAs layer.

12. A composite resonator-type semiconductor laser device according to claim 8 wherein the semiconductor substrate comprises an n-type GaAs substrate, the second cladding layer comprises an n-type AlGaAs layer, the active layer comprises a GaAs layer, the optical confinement layer comprises an $Al_xGa_{l-x}As/Al_yGa_{l-y}As$ superlattice layer between $0 < x < 1$, $0 < y \leq 1$, the first cladding layer comprises a p-type AlGaAs layer, and the cap layer comprises a p-type GaAs layer.

13. A composite resonator-type semiconductor laser device according to claim 8 wherein the semiconductor substrate comprises a p-type GaAs substrate, the second cladding layer comprises a p-type AlGaAs layer, the active layer comprises GaAs layers, the superlattice layer comprises a GaAs layer and an $Al_xGa_{l-x}As$ layer, the first cladding layer comprises an n-type GaAs layer.

14. A composite resonator-type semiconductor laser device according to claim 8 wherein the semiconductor substrate comprises an n-type GaAs substrate, the second cladding layer comprises an n-type AlGaAs layer, the active layer comprises a GaAs layer, the superlattice layer comprises GaAs layers and $Al_xGa_{l-x}As$ layers wherein $0 < x \leq 1$, the first cladding layer consists of a p-type AlGaAs layer, and the cap layer comprises a p-type GaAs layer.

15. In a composite resonator-type semiconductor laser device which has at least a first laser portion and a second laser portion, each of the laser portions having a first cladding layer, a second cladding layer, and an optical wavegude sandwiched between these cladding layers, the improvement wherein the first cladding layer, the second cladding layer, and the optical waveguide are common to each of the laser portions, the optical waveguide comprising one of an active layer of a quantum well structure and a superlattice structure, and crystals are damaged in the active layer in order to separate said first laser portion and said second laser portion.

16. In a composite resonator-type semioonductor laser device which has at least a first laser portion and a second laser portion, each of the laser portions having a first cladding layer, a second cladding layer, and an optical waveguide sandwiched between these cladding layers, the improvement wherein the first cladding layer, the second cladding layer, and the optical waveguide are common to each of the laser portions, the optical waveguide comprising an active layer and an optical confinement layer of a superlattice structure, and crystals are damaged in at least one of the optical confinement layer and the active layer in order to separate said first laser portion and said second laser portion.

* * * * *